US012598690B2

(12) United States Patent
Liu et al.

(10) Patent No.: US 12,598,690 B2
(45) Date of Patent: Apr. 7, 2026

(54) NEUTRAL BEAM INJECTION POWER FEEDBACK CONTROL METHOD

(71) Applicant: Hefei Institutes of Physical Sciences, Chinese Academy of Sciences, Hefei (CN)

(72) Inventors: Wei Liu, Hefei (CN); LiZhen Liang, Hefei (CN); YaHong Xie, Hefei (CN); YongJian Xu, Hefei (CN); JiangLong Wei, Hefei (CN); ChunDong Hu, Hefei (CN)

(73) Assignee: Hefei Institutes of Physical Sciences, Chinese Academy of Sciences, Hefei (CN)

( * ) Notice: Subject to any disclaimer, the term of this patent is extended or adjusted under 35 U.S.C. 154(b) by 0 days.

(21) Appl. No.: 19/059,108

(22) Filed: Feb. 20, 2025

(65) Prior Publication Data

US 2025/0393113 A1 Dec. 25, 2025

(30) Foreign Application Priority Data

Jun. 25, 2024 (CN) .......................... 202410824981.5

(51) Int. Cl.
 $H05H\ 1/02$ (2006.01)
 $G21B\ 1/05$ (2006.01)
 $H01J\ 37/304$ (2006.01)
(52) U.S. Cl.
 CPC ............. $H05H\ 1/02$ (2013.01); $H01J\ 37/304$ (2013.01); $G21B\ 1/057$ (2013.01)
(58) Field of Classification Search
 None
 See application file for complete search history.

(56) References Cited

U.S. PATENT DOCUMENTS 4,057,462 A * 11/1977 Jassby ...................... H05H 1/18
 376/124
4,065,351 A * 12/1977 Jassby ...................... G21B 1/13
 376/130
(Continued)

FOREIGN PATENT DOCUMENTS

CN 106206732 A * 12/2016 ............. H10D 88/01
CN 106930924 A * 7/2017 ............. F04B 37/08
(Continued)

OTHER PUBLICATIONS

Xie, Yahong et al., "Long Pulse Operation of Neutral Beam Injector on EAST Tokamak," Fusion Engineering and Design, Institute of Plasma Physics, Chinese Academy of Science, Hefei, China, 2023, 5 pages.
(Continued)

*Primary Examiner* — Srinivas Sathiraju
(74) *Attorney, Agent, or Firm* — Seed IP Law Group LLP

(57) ABSTRACT

The present invention provides a neutral beam injection power feedback control method, which belongs to the field of neutral beam injection, and studies the optimal matching relationship of operating parameters of the ion source by analyzing the ion optical characteristics of a hot cathode ion source so as to expand the optimal operating range of the ion source. Based on this, linear dynamic control of injection power in a single injection cycle is completed so as to form an operation mode based on plasma feedback. The process provided by the present invention includes the following two methods. Method 1, the beam power is dynamically adjusted under constant extraction energy. Method 2, under variable extraction energy, the tracking control of probe setting value is completed to realize the dynamic adjustment of beam power under variable energy. The present invention proposes a study protocol of continuously varying beam energy (Continued)

or beam power in a single injection cycle discharge to develop a study of dynamic control of injection power.

5 Claims, 5 Drawing Sheets

(56)                References Cited

U.S. PATENT DOCUMENTS

| | | | | |
|---|---|---|---|---|
| 4,115,191 | A * | 9/1978 | Ott | H05H 1/22 |
| | | | | 376/128 |
| 4,125,431 | A * | 11/1978 | Fowler | H05H 1/14 |
| | | | | 376/140 |
| 4,145,250 | A * | 3/1979 | Ohkawa | G21B 1/25 |
| | | | | 427/580 |
| 4,314,879 | A * | 2/1982 | Hartman | G21B 1/052 |
| | | | | 376/140 |
| 4,548,782 | A * | 10/1985 | Manheimer | G21B 1/23 |
| | | | | 376/127 |
| 9,462,669 | B2 * | 10/2016 | Prater | H05H 1/16 |
| 9,959,941 | B2 * | 5/2018 | McGuire | G21B 1/05 |
| 11,335,467 | B2 * | 5/2022 | Yang | G21B 1/052 |
| 11,646,139 | B2 * | 5/2023 | Xu | H01F 7/00 |
| | | | | 376/142 |
| 11,929,182 | B2 * | 3/2024 | Yang | H05H 1/14 |
| 12,278,485 | B1 * | 4/2025 | Jiang | H02H 9/04 |
| 12,287,311 | B2 * | 4/2025 | Huang | G01M 99/00 |
| 2010/0246740 | A1 * | 9/2010 | Kotschenreuther | G21B 1/057 |
| | | | | 376/146 |
| 2013/0089171 | A1 * | 4/2013 | Sykes | G21B 1/057 |
| | | | | 376/133 |
| 2015/0228369 | A1 * | 8/2015 | Cohen | G21B 1/052 |
| | | | | 376/123 |
| 2017/0236600 | A1 * | 8/2017 | Kingham | G21B 1/057 |
| | | | | 376/137 |
| 2018/0047463 | A1 * | 2/2018 | McGuire | G21B 1/057 |
| 2018/0090232 | A1 * | 3/2018 | McGuire | G21B 1/13 |

| | | | | |
|---|---|---|---|---|
| 2019/0326023 | A1 * | 10/2019 | Yang | H05H 1/14 |
| 2019/0355484 | A1 * | 11/2019 | Liu | H05H 3/00 |
| 2019/0392956 | A1 * | 12/2019 | Gryaznevich | G21B 1/11 |
| 2020/0005958 | A9 * | 1/2020 | Cohen | H05H 1/02 |
| 2020/0135343 | A1 * | 4/2020 | Noonan | G21F 3/00 |
| 2020/0234832 | A1 * | 7/2020 | Prater | G21B 1/05 |
| 2020/0343005 | A1 * | 10/2020 | McNamara | H05H 1/12 |
| 2021/0050134 | A1 * | 2/2021 | Slade | H02H 7/001 |
| 2022/0028591 | A1 * | 1/2022 | Brittles | H01F 41/048 |
| 2022/0208397 | A1 * | 6/2022 | Xu | H05H 1/12 |
| 2023/0051124 | A1 * | 2/2023 | Guo | G21B 1/05 |
| 2023/0307149 | A1 * | 9/2023 | Langtry | H01F 6/06 |
| 2023/0343498 | A1 * | 10/2023 | Brittles | G21B 1/11 |
| 2024/0038408 | A1 * | 2/2024 | Astbury | C22C 29/14 |
| 2024/0096509 | A1 * | 3/2024 | Chandra | G21B 1/05 |
| 2024/0387061 | A1 * | 11/2024 | Guo | G21B 1/17 |
| 2024/0418680 | A1 * | 12/2024 | Qin | G01N 29/4445 |

FOREIGN PATENT DOCUMENTS

| | | | | | |
|---|---|---|---|---|---|
| CN | 106206732 | B | * | 7/2019 | H05H 1/02 |
| CN | 118446120 | A | * | 8/2024 | G06N 3/08 |
| CN | 118468934 | A | * | 8/2024 | G06F 18/25 |
| CN | 119024075 | A | * | 11/2024 | G01R 31/00 |
| CN | 119154231 | A | * | 12/2024 | H02J 13/00017 |
| CN | 119643480 | A | * | 3/2025 | H02J 13/00017 |
| CN | 119724630 | A | * | 3/2025 | |
| WO | WO-2017083796 | A1 | * | 5/2017 | H05H 1/02 |

OTHER PUBLICATIONS

Xie, Yahong, "The study of Ion Source Characteristic for NBI based on Langmuir," Graduate School of Chinese Academy of Sciences, 2010, 175 pages.

Liu, Wei et al., "First Prototype of High-Speed Data Acquisition System of Ion Source for Neutral Beam Injection on EAST", Fusion Engineering and Design, 2018, 7 pages.

* cited by examiner

NEUTRAL BEAM INJECTION POWER FEEDBACK CONTROL METHOD

BACKGROUND

Technical Field

The present invention is in the field of neutral beam injection, and particularly relates to a neutral beam injection power feedback control method.

Description of the Related Art

Neutral Beam Injection (NBI) is a kind of auxiliary heating method with a clear physical mechanism and very effective heating means, which is widely used in fusion device plasma heating and current drive. The neutral beam injection device injects energetic neutral particles into the background plasma of the fusion device, which are ionized by collisions with electrons and ions. This portion of the ionized neutral particles forms fast ions, which are then confined by the magnetic field of the fusion device. Due to the higher energy of fast ions compared to the background plasma, heating of the background plasma is achieved by charge exchange under the influence of Coulomb collision. In view of the remarkable heating effect and clear physical mechanism of neutral beam injection, the nuclear fusion devices at home and abroad are equipped with an MW neutral beam injection system and widely used in various physical experiments.

Compared with the neutral beam injection system at home and abroad, the number of beam lines and injection power in fusion devices at abroad have great advantages, and they have carried out a wealth of physical experiments. The traditional neutral beam injection is to keep the power and beam energy stable in the plasma discharge region, and the plasma parameters gradually evolve to a steady state. A variety of high-parameter plasma experiments can be carried out by means of multiple ion sources working together. However, it is difficult to study the dynamic behavior by a single variable due to the large perturbation of the background plasma in this way, i.e., the equilibrium configuration, the background parameter profile and the instability spectrum change significantly under different beam injection. In addition, various magneto-hydrodynamic (MHD) instabilities occur in the plasma with increasing NBI capacity and device parameters, and the confinement parameters are further improved. These sources of instability include current distribution gradients, background kinetic pressure gradients, and high energy ion distribution gradients. In order to avoid these limits, it is necessary to give full play to the flexibility of local deposition of NBI on heating and current capability, such as changing the radial and pitch domain distribution locally and avoiding the drive threshold of high-energy particle mode. The current distribution profile is modified and the local distribution is modified.

To study the kinetic instability associated with energetic ions, it is necessary to change the heating conditions to study the physical mechanism. The common method is to inject multiple beam lines alternately and in superposition. This method needs multiple discharges for iterating out suitable heating parameters, which can heat effectively and avoid the instability caused by $\beta$ limit, but it has low efficiency and poor active control. Here, $\beta$ is the efficiency of confinement of plasma pressure by the magnetic field.

BRIEF SUMMARY

In order to solve the above-mentioned technical problem, the present invention provides a neutral beam injection power feedback control method. Based on the physical analysis requirements of neutral beam injection experiments and the system operation practice, the present invention proposes a study protocol of continuously varying beam energy or beam power in a single injection cycle discharge to develop a study of dynamic control of injection power.

In the present invention, the beam current and the beam power within a single injection period are actively controlled, namely, reducing the beam power when the plasma $\beta$ or the $\beta$ of high-energy ions approaches an instability limit by feedback of plasma diagnostic data and analysis results. The local distribution gradients in high-energy ions trigger high-energy particle mode (EPM) instability, which reduces the distribution gradients of free energy sources of instability by the cooperation of other beam lines.

In order to achieve the above purpose, the invention adopts the following technical solution.

A neutral beam injection power feedback control method includes the steps below:

step 1, by analyzing ion optical characteristics of a hot cathode ion source, a best matching relationship of the ion source operating parameters is studied, and a best operation interval of the ion source is expanded to obtain the matching relationship between a probe and extraction system parameters; a set interval of the probe under the beam energy is obtained by analyzing the corresponding relationship between a set value of a probe signal and a beam divergence angle under different beam energy, which provides a reference database for dynamic control of beam power;

step 2, linear dynamic control of injection power in a single injection cycle is completed by the reference database in the step 1 so as to form an operation mode based on plasma feedback;

step 3, according to the dynamic control requirements of beam energy and beam power and the characteristics of the neutral beam system itself, a corresponding function upgrade is performed on the control system, and also a targeted high-precision fast isolation transmission circuit is designed.

Furthermore, in the step 1, the parameter setting range of an optimal operation interval of the ion source is obtained by analyzing the influence of plasma generation configurations, proton ratios and different high voltage division ratios on a beam divergence angle in different extraction grids; and performing operation matching in the arc power feedback mode on the basis of the parameter setting range.

Further, the parameter setting range of the optimal operation interval of the ion source is $$P = \frac{I}{U^{1.5}} * 10^6;$$

where I is the extraction current; U is the extraction voltage; P is the perveance; and under a fixed extraction voltage condition, the range of the extraction current I is derived according to the operation interval of the perveance P.

Further, the step 2 includes the steps below:

step I, the beam energy is kept unchanged, the arc power is adjusted by changing the set value of the probe, the dynamic adjustment of the injection power is realized within an optimal operation window interval, and ascending and descending of the injection power are realized under the condition of fixed beam energy; the dynamic feedback control of plasma density on the injection power is realized by the single-variable control;

step II, the dynamic adjustment of the beam energy within a single injection period is realized; and also, the probe setting signal continuously changes following the adjustment of the beam energy, namely, the arc power tracking beam energy is automatically adjusted so as to enable the ion source to work under the condition of an optimal perveance.

Further, the step 3 includes the steps that, firstly, the real-time and accurate acquisition of various experimental parameters is realized based on the existing control system, and the probe signal, beam energy setting and deflection magnet setting are transmitted quickly and accurately according to the reference database; and various injection modes are realized according to the working characteristics of neutral beam system and combined with the closed-loop control theory.

Beneficial Effects

The high-energy particle driven instability needs to satisfy the wave-particle resonance condition and exceed the high-energy particle β threshold. That is, there are both energy source and wave-particle energy propagation channel. In the present invention, the EPM excitation condition can be accurately obtained by keeping the injection power constant, continuously varying the beam energy, i.e., keeping the β of the distribution of high-energy particles constant, and continuously scanning beam energy continuously varying distribution function. The combined control of multiple beam lines keeps the total heating power and beam energy constant, but the total external input momentum changes, so that the plasma rotation profile changes continuously. The instability driving and attenuation conditions change continuously so that the stability and driving effect of instability can be studied more clearly.

The dynamic beam power control in a single injection cycle achieved in the DC injection mode has not been reported in China. The successful implementation of the present invention can greatly improve the research level of neutral beam injection and provide necessary technical support for carrying out a variety of physical experiments in future fusion devices.

DETAILED DESCRIPTION

Figure 1:
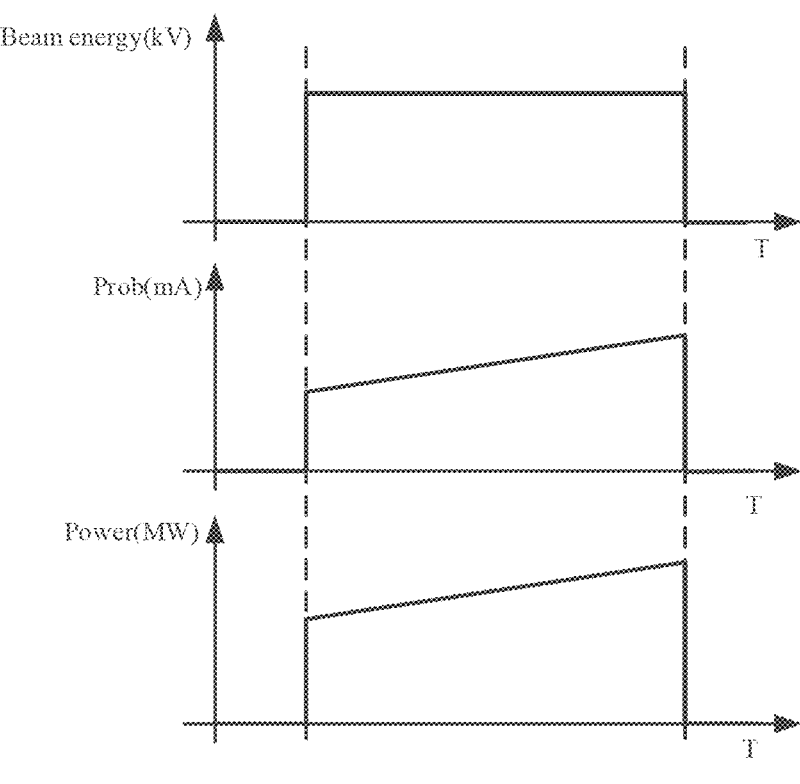
FIG. 1 is a waveform diagram of beam power control at constant extraction energy.

In order that the objects, aspects and advantages of the present invention will become more apparent, a more particular description of the invention will be rendered by reference to the appended drawings and the embodiments. It should be understood that the specific examples described herein are merely used for explanation of the invention and are not intended to be limiting thereof. Furthermore, the technical features involved in the various embodiments of the present invention described below can be combined with each other as long as they do not conflict with each other.

The present invention studies the optimal matching relationship of operating parameters of the ion source by analyzing the ion optical characteristics of a hot cathode ion source so as to expand the optimal operating range of the ion source. Based on this, linear dynamic control of injection power in a single injection cycle is completed so as to form an operation mode based on plasma feedback. The present invention includes two injection power regulation methods in the direct current injection mode. Regulation method 1, the beam power is dynamically adjusted under constant extraction energy. Regulation method 2, under variable extraction energy, the tracking control of probe setting value is completed to realize the dynamic adjustment of beam power under variable energy.

The current Institute of Plasma Physics, Chinese Academy of Sciences (ASIPP) neutral beam injection system includes a DC injection mode and a modulation mode. The DC injection mode can keep the beam energy constant in a single injection period. The modulation mode adjusts the injection power by controlling the duty cycle. In the present invention, by analyzing the extraction characteristics of a hot cathode ion source, the action mechanism of a probe signal and a perveance is explored, and a relational database and a regulation function of beam energy, beam power and a probe signal in an operation region of the ion source are constructed. Based on this, the study on dynamic control of beam power in a single injection cycle is conducted, which specifically includes the following steps:

Step 1, a best operation interval of the ion source is expanded to obtain the matching relationship between a probe and extraction system parameters.

At present, the hot cathode ion source used in the ASIPP neutral beam system has two kinds of grids, diamond and circular. The different structures have a certain impact on the generation and extraction of plasma. For the hot cathode ion sources, plasma generation configurations, proton ratios, and different accelerating partial pressure ratios result in differences in beam divergence angles. Therefore, the present invention obtains the parameter setting range of the optimal operation interval of the ion source by analyzing the influence of the above-mentioned factors on the beam divergence angle under different extraction grids. Based on this, the operation matching under the feedback mode of arc power probe was carried out. The set interval of the probe under the beam energy is obtained by analyzing the corresponding relationship between a set value of a probe signal and a beam divergence angle under different beam energy, which provides a reliable reference database for following dynamic control of beam power. The establishment of the reference database can effectively guide the adjustment range of beam power and provide the reference basis for the interlock protection of the system, which has a vital role.

The parameter setting range of the optimal operation interval of the ion source is $$P = \frac{I}{U^{1.5}} * 10^6.$$

In the formula, I is the extraction current; U is the extraction voltage; P is the perveance; and under a fixed extraction voltage condition, the range of the extraction current I may be derived according to the operation interval of the perveance P.

Step 2, the performing corresponding beam power dynamic control by the reference database established in the Step 1, specifically includes:

Step I, the beam energy is kept unchanged, the arc power is adjusted by changing the set value of the probe, and the dynamic adjustment of the injection power is realized within an optimal operation window interval, and in this control mode, ascending and descending of the injection power are realized under the condition of fixed beam energy.

For the fusion device, in the initial stage of plasma establishment or in the process of low density, it is very easy to cause plasma disturbance or even breakage under the high energy injection mode of neutral beam. Step I can achieve dynamic feedback control of plasma density on injection power by single-variable control.

Step II, the dynamic adjustment of the beam energy within a single injection period is realized; and also, the probe setting signal continuously changes following the adjustment of the beam energy, namely, the arc power tracking beam energy is automatically adjusted so as to enable the ion source to work under the condition of an optimal perveance.

The Step I and Step II need to realize the linear control of the acceleration power supply, and at the same time, to realize the linkage with the beam energy by the arc power supply system based on probe feedback and the reference database established in the Step 1. The probe setting signal and the beam energy can realize double-variable linkage control, which can greatly extend the linear adjustment range of beam power in a single injection cycle of the neutral beam system, and realize linear dynamic control of injection power. By changing the beam energy and input momentum continuously, the distribution function of high-energy particles can be actively controlled to avoid the wave-particle resonance condition for exciting the relative instability of fast particles, or to reduce the disturbance amplitude of instability and reduce the loss of fast ions. Precise control of the neutral beam injection momentum can actively control the plasma rotation profile and study the spontaneous rotation mechanism in low momentum input experiments.

Step 3, according to the dynamic control requirements of beam energy and beam power proposed in the present invention and the characteristics of the neutral beam system itself, a corresponding function upgrade is performed on the current control system, and also a targeted high-precision fast isolation transmission circuit is designed.

Firstly, the real-time and accurate acquisition of various experimental parameters is realized based on the existing control system, and the probe signal, beam energy setting, deflection magnet setting and so on are transmitted quickly and accurately according to the reference database. In order to achieve the feedback requirements of NBI for the Experimental Advanced Superconducting Tokamak (EAST) plasma control, the present invention implements a variety of injection modes based on the operating characteristics of the neutral beam system in combination with the closed loop control theory.

Specifically, in the Step 1, the operation interval of the system is expanded by analyzing the operation experimental data of the ion source, optimizing various experimental parameters such as the gas control, the amplitude setting of the ion source power supply, and the extraction voltage division ratio. A database of beam energy and perveance based on the probe feedback is established to provide reliable design basis for various control modes of beam power.

According to the operation data of ion source, the parameter matching relationship under different extraction energy is obtained by the theoretical analysis and experimental summary. Based on this, the corresponding relationship between the probe amplitude and each extracted energy and power is analyzed, and the corresponding regulation function is established. Meanwhile, the interval range of the probe set in the optimal operation range is calculated, which provides an important reference for further expanding the power adjustment range.

Specifically, in the Step 2, in the direct current injection mode, the probe feedback-based arc power supply, the deflection magnet power supply and the like are matched with the dynamic adjustment of the extracted energy. In the present invention, an overall consideration is given to the dynamic response performance of each subsystem and the matching requirements between the systems to achieve dynamic adjustment of beam power within a single injection cycle. The extraction energy and probe setting signal are dynamically adjusted according to the fastest response time of extraction power supply and arc power supply. In the adjustment process, for how the probe signal tracks the change of beam extraction energy, the amplitude and speed of adjustment will affect the operation state of ion source. If the probe setting signal is adjusted too fast, it is easy to change the plasma configuration and even lead to plasma extinction. If the speed of adjustment is too slow, tracking of beam energy by the arc power cannot be achieved. Therefore, it is very critical to obtain the matching operation interval between the key experimental parameters such as probe setting signals, deflection magnet power supply and the beam energy.

In the Step 1, depending on the currently available diagnostic method, the parameter points which may be operated under each extraction energy of the ion source is scanned, and the iterative relationship between the set value of the probe and the operation interval of the extraction system is obtained by combining theoretical analysis with experiments. By the implementation of this step, it is feasible to establish the database of probe setting range in the optimal operation interval under different extraction energy of ion source. Meanwhile, under the operating conditions of the optimal beam divergence angle, the change of the extracted energy and the quantitative relationship of the change amplitude of the probe signal tracking the beam energy can be accurately obtained by the implementation of this stage. In the above process, filament power supply and deflection magnet power supply adopt similar research methods except arc power regulation based on the probe feedback, and the corresponding relationship under different extraction energy is obtained.

The Step 2 develops the formulation of the beam power dynamic control method within a single injection period according to the Step 1. The beam power dynamic control method of the present invention includes the following two methods.

Method 1: beam extraction power boost at the constant beam energy. The beam extraction energy is controlled as a constant value, and the probe and filament are selected as the controlled quantity. On the basis of the reference database in Step 1, the arc power boost in the optimal operation interval is achieved to complete the extraction power climbing. Since no change in the beam energy is involved, it suffices that the magnet power supply maintains an initial setting at this stage. As shown in FIG. 1, the abscissa represents time T in the unit of second(s).

Figure 2:
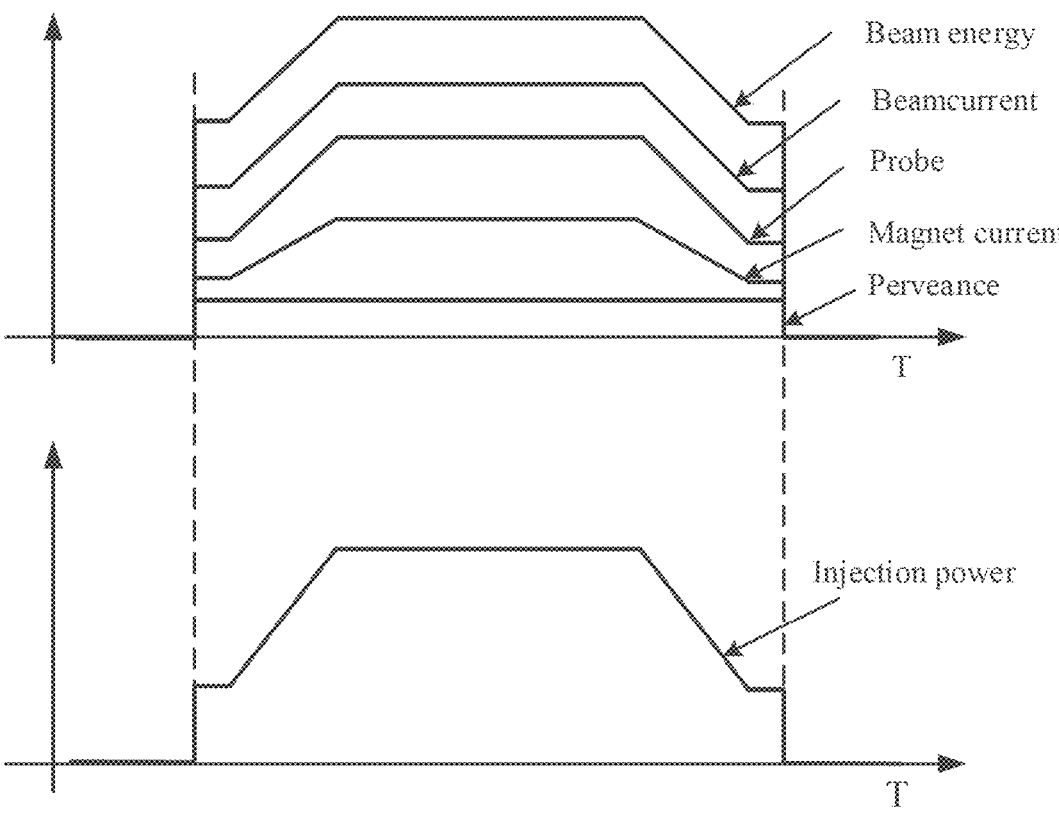
FIG. 2 is a schematic diagram of beam power control at variable extraction energy.

Method 2: any waveform changes in the beam energy within a single implant cycle. By changing the beam energy amplitude setting, the probe signal tracks the change of beam energy to achieve dynamic beam power control in the operation range. On the basis of Step 1, the beam power feedback control system calculates the variation trend of the probe, the filament and the magnet power supply by analyzing the variation range of beam energy, so as to ensure that the ion source operates under the extraction condition of the optimal beam divergence angle. As shown in FIG. 2, the Method 2 needs to test and analyze the response time of various subsystems, such as the extraction power supply, the probe feedback system, the filament power supply and the magnet power supply so as to obtain the optimal change rate by comprehensive analysis. For the arc power supply, the plasma shape, the quality and so on are easy to change, and even breakage occurs, when the adjusting speed is too fast. Too slow adjustment affects the beam power dynamic response range of the overall system. Therefore, it is necessary to comprehensively analyze the characteristics of each system and combine with experimental verification to complete the optimal control strategy.

Figure 3:
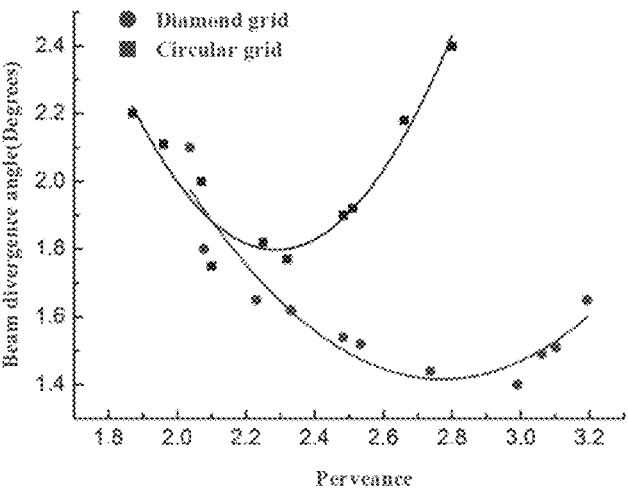
FIG. 3 is a graph comparing the extraction capability of diamond and circular grids.
Figure 4:
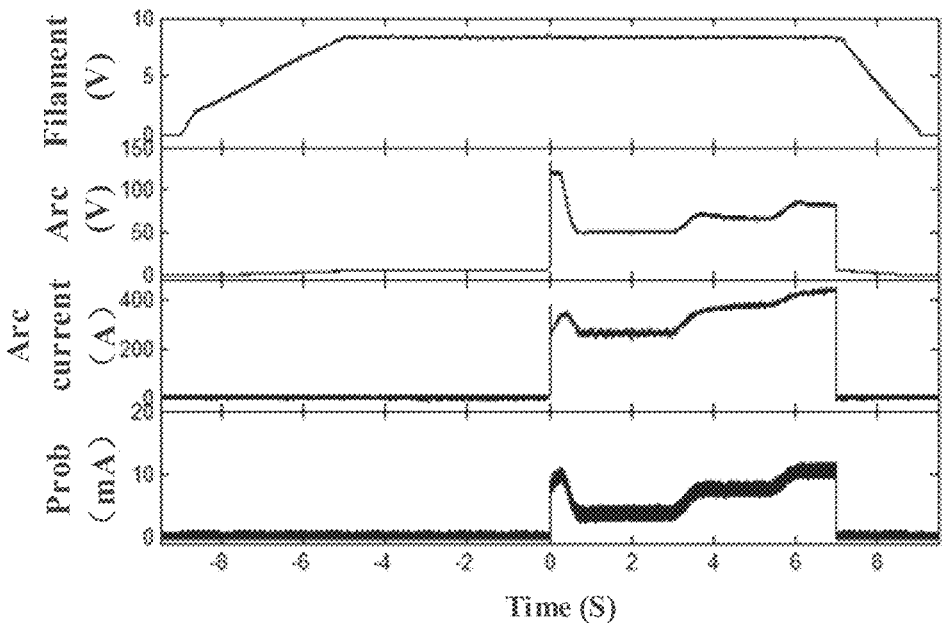
FIG. 4 is a waveform diagram of arc power ramp control.

The hot cathode ion source, the core of the present invention, has been developed for many years and is now well understood. Based on the circular extraction grid, the present invention develops the design of the diamond extraction grid and successfully applies it to the ion source operation experiment. The diamond shaped extraction grid has a larger power adjustment range than the circular extraction grid. As shown in FIG. 3, compared with the circular grid, the diamond grid structure has stronger extraction capacity and operation interval. It is feasible to further expand the operation window and realize the dynamic control of beam power in a single injection cycle by carrying out the matching study of ion source discharge parameters. FIG. 4 shows a closed loop control technique for the arc power supply based on the arc power and probe feedback. Based on this, by upgrading and optimizing the control system, the closed-loop control algorithm of outgoing beam current is completed.

The present invention studies the optimal matching relationship of operating parameters of the ion source by analyzing the ion optical characteristics of a hot cathode ion source so as to expand the optimal operating range of the ion source. Based on this, linear dynamic control of injection power in a single injection cycle is completed so as to form an operation mode based on plasma feedback.

The three modes (two of the DC injection mode, and the modulation injection mode) are switchable.

Mode 1, beam closed-loop mode. It is consistent with the existing beam closed-loop, it is used when the power boost is not required.

Figure 5:
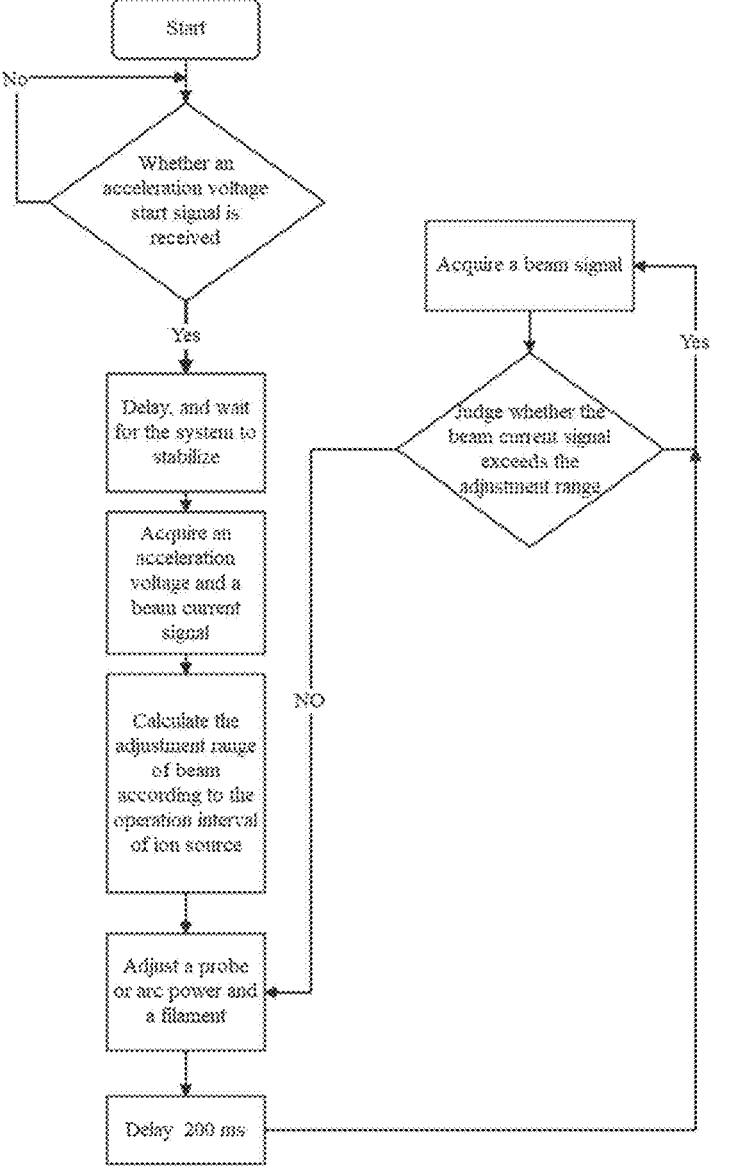
FIG. 5 is a flow chart of Method 1.

Mode 2, as shown in FIG. 5, the high voltage is stabilized and the arc power is increased, namely, for adjusting the arc power and the filament and increasing the injection power under the condition of fixed extraction energy, specifically including the followings.

When the system starts to operate, it waits for the voltage trigger signal to occur to confirm whether the acceleration voltage start signal is received, i.e., judging whether the voltage trigger signal occurs. If it occurs, it delays and waits for the system to be stable. After the system is stable, it starts to collect the acceleration voltage and the beam current signal. The beam current adjustment range is calculated according to the operation interval of the ion source. The probe or arc power and filament parameters are adjusted. It is delayed for 200 ms after the adjustment is completed, and then it is judged whether the beam current signal exceeds the adjustment range. If yes, the probe or arc power and filament setting value is decreased and the beam current signal is collected, otherwise it returns to adjust the probe or arc power and filament parameters. When the system starts, it is judged whether the start signal is lost, if yes, it stops all amplitude outputs and initializes relevant variables, otherwise returns for re-judgment.

Figure 6:
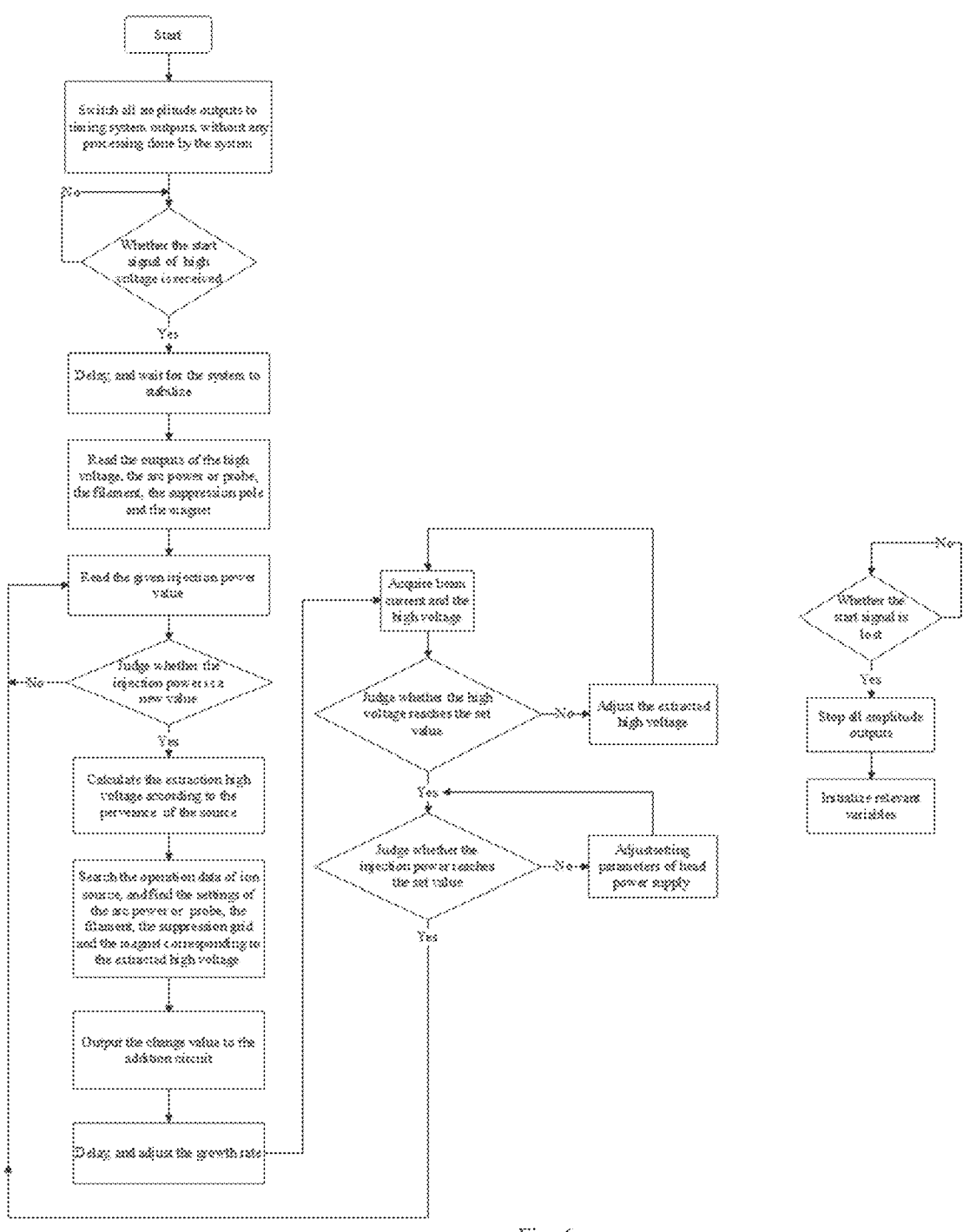
FIG. 6 is a flow chart of Method 2.

Mode 3, as shown in FIG. 6, it is follow-up control of high voltage and injection power, namely, realizing linear control of injection power, during which the filament, the arc power, the magnet and a suppression grid follow-up with the extraction of high voltage, and specifically includes:

The system starts to operate. When all amplitude outputs are switched to timing system outputs, the system does not perform any processing, and the system will wait for a high voltage start signal to occur. When a high voltage start signal is detected, it will delay and wait for the system to stabilize, and at the same time, read high voltage and arc power or output values of a probe, a filament, a suppression grid and a magnet, and read a given injection power value. When the injection power is not a new value, it returns to a reading stage. When the injection power is a new value, an extracted high voltage is calculated according to a perveance of the ion source, and the operation data of the ion source is searched for finding out setting values of arc power or a probe, a filament, a suppression grid and a magnet corresponding to the extracted high voltage. A change value is output to an addition circuit, and a beam current and a high-voltage signal are acquired after delay processing and adjusting a growth rate. It is judged whether the high voltage reaches a set value. If the set value is not reached, the extracted high voltage is adjusted, and it returns to collect the beam current and the high voltage signal. If the set value is reached, it is judged whether the injection power reaches the set value. If the set value is not reached, the set parameter is adjusted. If the set value is reached, it returns to the injection power value read and repeats the cycle. When the system starts, it is judged whether the start signal is lost. If yes, it stops all amplitude outputs and initializes relevant variables, otherwise returns for re-judgment.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A neutral beam injection power feedback control method, comprising the steps below:

step 1, by analyzing ion optical characteristics of a hot cathode ion source, a best matching relationship of the ion source operating parameters is studied, and a best operation interval of the ion source is expanded to obtain the matching relationship between a probe and extraction system parameters; a set value interval of the probe under different beam energy is obtained by analyzing corresponding relationship between a set value of a probe signal and a beam divergence angle under different beam energy, which provides a reference database for dynamic control of beam power;

step 2, linear dynamic control of injection power in a single injection cycle is completed by the reference database established in the step 1 so as to form an operation mode based on plasma feedback; and step 3, according to the dynamic control requirements of beam energy and beam power and characteristics of a neutral beam system, a corresponding function upgrade is performed on a control system, comprising the steps that, firstly, the real-time and accurate acquisition of various experimental parameters is realized based on the existing control system, and the probe signal, beam energy setting and deflection magnet setting are transmitted quickly and accurately according to the reference database; and various injection modes are realized according to the working characteristics of the neutral beam system and combined with the closed-loop control theory, wherein the step 2 comprises the steps below:

step I, the beam energy is kept unchanged, the arc power is adjusted by changing the set value of the probe, and the dynamic adjustment of the injection power is realized within an optimal operation window interval, and ascending and descending of the injection power are realized under the condition of fixed beam energy: the dynamic feedback control of plasma density on the injection power is realized by the single-variable control;

step II, the dynamic adjustment of the beam energy within a single injection period is realized; and also, the probe setting signal continuously changes following the adjustment of the beam energy, namely, the arc power tracking beam energy is automatically adjusted so as to enable the ion source to work under the condition of an optimal perveance.

2. The neutral beam injection power feedback control method according to claim 1, wherein, in the step 1, the parameter setting range of an optimal operation interval of the ion source is obtained by analyzing the influence of plasma generation configurations, proton ratios and different acceleration partial pressure ratios on a beam divergence angle in different extraction grids; and performing operation matching in the arc power probe feedback mode on the basis of the parameter setting range.

3. The neutral beam injection power feedback control method according to claim 2, wherein the ion source operating parameters are determined as $$P = \frac{1}{U^{1.5}} * 10^6.$$

where P is perveance, U is an extraction voltage, I is an extraction current, and under a fixed extraction voltage condition, a range of the extraction current I is derived according to an operation interval of the perveance P.

4. A neutral beam injection power feedback control method, comprising the steps below:

step 1, by analyzing ion optical characteristics of a hot cathode ion source, a best matching relationship of the ion source operating parameters is studied, and a best operation interval of the ion source is expanded to obtain the matching relationship between a probe and extraction system parameters; a set value interval of the probe under different beam energy is obtained by analyzing corresponding relationship between a set value of a probe signal and a beam divergence angle under different beam energy, which provides a reference database for dynamic control of beam power;

step 2, linear dynamic control of injection power in a single injection cycle is completed by the reference database established in the step 1 so as to form an operation mode based on plasma feedback; and step 3, according to the dynamic control requirements of beam energy and beam power and characteristics of a neutral beam system, a corresponding function upgrade is performed on a control system, comprising the steps that, firstly, the real-time and accurate acquisition of various experimental parameters is realized based on the existing control system, and the probe signal, beam energy setting and deflection magnet setting are transmitted quickly and accurately according to the reference database; and various injection modes are realized according to the working characteristics of the neutral beam system and combined with the closed-loop control theory, wherein, in the step 1, the parameter setting range of an optimal operation interval of the ion source is obtained by analyzing the influence of plasma generation configurations, proton ratios and different acceleration partial pressure ratios on a beam divergence angle in different extraction grids; and performing operation matching in the arc power probe feedback mode on the basis of the parameter setting range, and wherein the ion source operating parameters are determined as $P=1/U^{1.5}*10^6$, where P is perveance, U is an extraction voltage, I is an extraction current, and under a fixed extraction voltage condition, a range of the extraction current I is derived according to an operation interval of the perveance P.

5. The neutral beam injection power feedback control method according to claim 4, wherein the step 2 comprises the steps below:

step I, the beam energy is kept unchanged, the arc power is adjusted by changing the set value of the probe, and the dynamic adjustment of the injection power is realized within an optimal operation window interval, and ascending and descending of the injection power are realized under the condition of fixed beam energy; the dynamic feedback control of plasma density on the injection power is realized by the single-variable control;

step II, the dynamic adjustment of the beam energy within a single injection period is realized; and also, the probe setting signal continuously changes following the adjustment of the beam energy, namely, the arc power tracking beam energy is automatically adjusted so as to enable the ion source to work under the condition of an optimal perveance.

* * * * *